United States Patent [19]

Cockayne et al.

[11] Patent Number: 4,509,997
[45] Date of Patent: Apr. 9, 1985

[54] ORGANOMETALLIC CHEMICAL VAPOR DEPOSITION OF FILMS UTILIZING ORGANIC HETEROCYCLIC COMPOUNDS

[75] Inventors: Brian Cockayne, Malvern; Richard J. M. Griffiths; Peter J. Wright, both of Lower Wick, all of England

[73] Assignee: The Secretary of State for Defence in Her Britannic Majesty's Government of the United Kingdom of Great Britain and Northern Ireland, London, England

[21] Appl. No.: 543,003

[22] Filed: Oct. 18, 1983

[30] Foreign Application Priority Data

Oct. 19, 1982 [GB] United Kingdom ............... 8229830

[51] Int. Cl.³ ............... H01L 21/205; H01L 21/365
[52] U.S. Cl. ............... 148/175; 29/576 E; 148/174; 156/612; 156/613; 156/614; 156/DIG. 70; 427/87
[58] Field of Search ............... 148/174, 175; 156/612–614, DIG. 70; 29/576 E; 427/87

[56] References Cited

U.S. PATENT DOCUMENTS

| | | | |
|---|---|---|---|
| 3,462,323 | 8/1969 | Groves | 148/175 |
| 3,492,175 | 1/1970 | Conrad et al. | 148/175 |
| 3,922,475 | 11/1975 | Manasevit | 156/613 X |
| 4,066,481 | 1/1978 | Manasevit et al. | 148/174 |
| 4,214,926 | 7/1980 | Katsuto et al. | 148/175 |
| 4,247,359 | 1/1981 | Venkatasetty | 156/613 |
| 4,250,205 | 2/1981 | Constant et al. | 156/613 X |
| 4,368,098 | 1/1983 | Manasevit | 156/614 X |

FOREIGN PATENT DOCUMENTS 1600283 10/1981 United Kingdom .

Primary Examiner—William G. Saba
Attorney, Agent, or Firm—Cushman, Darby & Cushman

[57] ABSTRACT

There is provided a method of producing inorganic thin films by metal inorganic chemical vapor deposition. The method comprises forming a vapor stream comprising a vapor mixture of an organometallic compound and a heterocyclic organic compound incorporating a group V or group VI element, and thermally decomposing the mixture on a heated substrate to form an inorganic layer. The heterocyclic compound may be an aliphatic or aromatic ring compound. The mixture may include vapors appropriate for deposition of ternary or higher order compounds, and/or for introducing dopants.

8 Claims, 3 Drawing Figures

ORGANOMETALLIC CHEMICAL VAPOR DEPOSITION OF FILMS UTILIZING ORGANIC HETEROCYCLIC COMPOUNDS

This invention relates to organometallic chemical vapour deposition of films of inorganic materials. The method is particularly, although not exclusively, relevant to thin film production.

It is known to employ organometallic vapour deposition for inorganic film production. In particular UK Pat. No. 1,600,286 describes a method of III-V compound thin film production wherein a mixture of a group III metal alkyl and a group V element hydride in a hydrogen stream are thermally decomposed to form a III-V compound film on a substrate. More generally, the method of Metal Organic Chemical Vapour Deposition (hereinafter called MOCVD) has been employed to produce thin films of various III-V and II-VI compounds and their alloys. The starting reagents normally employed in this method are the metal alkyls of the elements of groups II and III and the hydrides or alkyls of the elements of groups V and VI. Examples of such reagents are shown in Table I below, where R represents an alkyl group (methyl, ethyl, propyl, butyl, etc along the homologous series).

TABLE I
EXAMPLES OF KNOWN MOCVD REAGENTS

| GROUP II ALKYLS | GROUP III ALKYLS |
| --- | --- |
| $Zn R_2$ | $Ga R_3$ |
| $Cd R_2$ | $Al R_3$ |
| $Hg R_2$ | $In R_3$ |
| $Be R_2$ | $BR_3$ |
| $Mg R_2$ | |

| HYDRIDES OF GROUP V | HYDRIDES OF GROUP VI |
| --- | --- |
| $AsH_3$ | $H_2S$ |
| $PH_3$ | $H_2Se$ |
| $SbH_3$ | $H_2O$ |
| $NH_3$ | |

| ALKYLS OF GROUP V | ALKYLS OF GROUP VI |
| --- | --- |
| $AsR_3$ | $SR_2$ |
| $PR_3$ | $SeR_2$ |
| $SbR_3$ | $TeR_2$ |
| $NR_3$ | $OR_2$ |

Equations representing typical reactions employed in MOCVD are:

Zinc Alkyl + Hydrogen Sulphide   Zinc Sulphide + Alkane

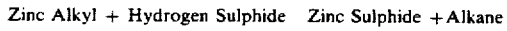

Gallium Alkyl + Arsine   Gallium Arsenide + Alkane

Although MOCVD has been used successfully to prepare various of II-VI and III-V compounds and alloys, preparation problems may arise. In some cases, "parasitic" or "premature" reactions occur at room temperature when the reagents are mixed. These give rise to undesirable premature reaction products, and cause non-uniformities in thicknesses and electrical and optical properties in the deposited films. Such "parasitic" reactions adversely affecting the deposition processes include:

Trimethyl indium + Phosphine   Polymer

The polymeric material indicated in Reaction (3) is solid; its formation depletes the gas phase of reagents. Reagent depletion affects the processes occurring in the film deposition zone of the reactor. The phosphorus atom of the hydride possesses a loan pair of electrons, the pair being readily available for bond formation (Lewis Base). Moreover, the indium of the alkyl is strongly electron accepting (Lewis Acid). As an initial consequence of these acidic and basic properties, a co-ordination bond forms between the indium and phosphorus. Subsequently, methane is eliminated to form the polymer in reaction (3) above.

A further prior art reaction used to prepare zinc sulphide thin films is as follows:

Dimethyl zinc   Hydrogen Sulphide   Zinc Sulphide   Methane

Reaction (4) occurs to a degree at room temperature, and consequently the gas phase becomes depleted prior to the film deposition zone being reached.

It is an object of the present invention to provide an alternative method of MOCVD production of thin films.

The present invention provides an MOCVD method of inorganic film production including the steps of:

(1) forming a vapour stream consisting at least partly of a mixture of the vapours of an organometallic compound and a heterocyclic organic compound incorporating a group V or group VI element; and (2) passing the vapour stream over a heated substrate for reaction and decomposition of the organometallic and heterocyclic compounds to deposit an inorganic thin film having metal and group V or group VI element constituents.

It has been found that the incorporation of the group V or group VI element in a heterocyclic compound inhibits undesirable reactions upstream of the heated substrate when employed in MOCVD film production. This is advantageous as compared to the use of prior art group V or group VI hydrides or alkyls in MOCVD, since it reduces the scope for reagent depletion and consequent film non-uniformity arising from premature vapour reaction. The method of the invention is particularly appropriate for use in inorganic thin film production, where film non-uniformity is highly undesirable.

The method of the invention may be employed in the production of II-VI, III-VI or III-V binary film compounds, or for the production of related ternary or quaternary materials where appropriate volatile organometallic and heterocyclic compounds exist. The invention may also be used for producing group III-V material doped with group VI elements, or group II-VI materials doped with group V elements. In each case the appropriate vapour stream mixture is formed.

The group V or VI element may be incorporated in aliphatic heterocyclic ring compounds and their derivatives, such as cyclic arsines, cyclic stibines, cyclic amines, cyclic ethers, cyclic thioethers, cyclic selenoethers and cyclic telluroethers. Alternatively, the group V or VI elements may be incorporated in aromatic heterocyclic ring compounds and their derivatives, such as arsoles, phospholes, stiboles, pyrroles, furans, thiophenes, selenophenes or tellurophenes.

ZnS and ZnO films may be produced in accordance with the invention for the production of DC or AC electroluminescent panels.

The invention will now be described by way of example only with reference to the accompanying examples and drawings in which.

Figure 1:
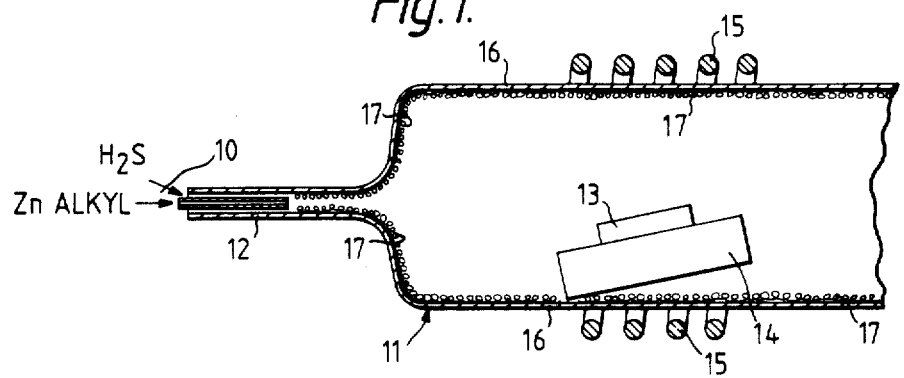
FIG. 1 illustrates MOCVD equipment.

Referring to FIG. 1, a mixed zinc alkyl/hydrogen sulphide vapour stream 10 enters a reaction vessel 11 at a neck 12 for the purposes of a prior art MOCVD technique of inorganic thin film production. The vapour stream 10 is intended to decompose to a zinc sulphide film (with the release of an alkane) on a heated substrate 13. The substrate 13 is supported on a susceptor block 14 rf heated by a coil 15 and rf supply (not shown). Due to undesirable or premature reactions the stream 10 may decompose on the walls 16 of the vessel 11. This decomposition may produce deposits 17 upstream and downstream of the susceptor block 14. Such deposition occurs particularly in the reaction of hydrogen sulphide and dimethyl zinc, which react to produce zinc sulphide and methane as set out in Reaction (4) above. Premature reaction leads to deposits upstream of the susceptor block 14, which receives a seriously depleted vapour stream resulting in non-uniform film growth. Downstream reaction, being after deposition, does not influence film uniformity.

Table II gives reaction details of Examples (1) to (7) of the production of zinc sulphide, zinc oxide and zinc selenide films in accordance with the invention, ie employing heterocyclic compounds of sulphur and oxygen in place of the prior art hydrides or alkyls. Temperatures in parentheses indicate the temperatures at which the relevant liquids are maintained, which controls the vapour pressure of the corresponding constituent in the vapour mixture stream.

Whereas Examples (1) to (7) are binary compounds, ternary or higher order compounds may be produced by forming appropriate mixtures of vapour streams. Similarly, films doped with impurities may be formed by including in the vapour stream 10 a proportion of the vapour of a suitable volatile compound containing the impurity. In particular, manganese-doped ZnS may be produced by adding methylcyclopentadienyltricarbonyl manganese to the vapour stream 10. Moreover, multilayer structures may be deposited by employing a succession of different vapour streams of appropriate compositions.

Figure 2:
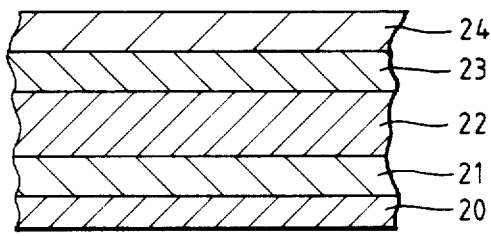
FIGS. 2 and 3 are schematic cross-sectional views of electroluminescent devices including layers made in accordance with the invention.
Figure 3:
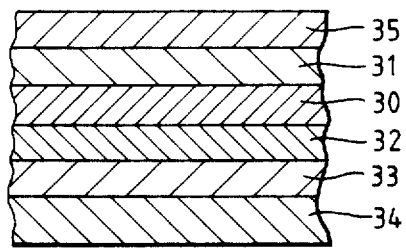

Referring now to FIGS. 2 and 3, these show respectively schematic cross-sectional views of conventional DC and AC electroluminescent devices which may be produced with the aid of the invention. In FIG. 2, a glass substrate 20 bears a ZnO transparent electrically conducting thin film 21 laid down in accordance with Example (3). An Mn-doped ZnS electroluminescent film 22 is laid on the ZnO layer 21 in accordance with Example (1) or (2). A current control layer 23 and a metallisation layer 24 produced by conventional techniques complete the electroluminescent device. In FIG. 3, an Mn-doped ZnS electroluminescent film 30 is arranged between upper and lower insulating dielectric films 31 and 32 upon a ZnO transparent conducting film 33. The multilayers 30 to 33 are mounted on a substrate 34 and have an uppermost metallisation layer 35. The ZnS and ZnO layers may be produced in accordance with the Examples, and the dielectric layers by conventional techniques.

In reactions in accordance with the Examples, it has been found that there has been no observable unwanted film deposition upstream of the substrate 13. Furthermore, the films of ZnS and ZnO produced have shown no visible degree of wedge non-uniformity. ZnS films produced by prior art techniques may exhibit visible wedge interference fringes, indicating greater thickness in the upstream region as compared to that downstream, a consequence of reactant depletion in the vapour stream. Accordingly, films produced in accordance with the invention exhibit improved uniformity as compared to the prior art.

The invention reduces the scope for vapour depletion by inhibiting undesirable or "parasitic" reactions. To achieve this, the group V or VI elements are incorporated in heterocyclic compounds which may be either aliphatic or aromatic. Examples of aliphatic heterocyclic ring systems are cyclic phosphines, cyclic arsines, cyclic stibines, cyclic amines, cyclic ethers, cyclic thioethers, cyclic selenoethers and cyclic telluroethers. Examples of aromatic heterocyclic ring systems are arsoles, phospholes, stiboles, pyrroles, furans, thiophenes, selenophenes and tellurophenes.

In addition to its use to prepare ZnS and ZnO, the invention is applicable to the production of other II-VI compounds and alloys thereof.

The II-VI binary compounds are:

| ZnO  | CdO  | HgO  |
|------|------|------|
| ZnS  | CdS  | HgS  |
| ZnSe | CdSe | HgSe |
| ZnTe | CdTe | HgTe |

The invention is also applicable to the preparation of the III-V compounds and their alloys, the binary III-V compounds being:

| BN  | AlN  | GaN  | InN  |
|-----|------|------|------|
| BP  | AlP  | GaP  | InP  |
| BAs | AlAs | GaAs | InAs |
| BSb | AlSb | GaSb | InSb |

The invention is further applicable to other binary and higher order oxides and compounds, such as $Al_2O_3$, $Ga_2O_3$, SiO, $Zn_2SiO_4$, etc and derivatives thereof where suitable volatile metal organic and related compounds exist.

Inorganic films produced in accordance with the invention have a wide range of possible uses, such as the following (examples are given in parenthesis):

1. Luminescent panels (ZnS)
2. Transparent conductors (ZnO)
3. Surface acoustic wave devices (ZnO)
4. Microwave devices (InP)
5. Light emitting diodes (GaInAsP)
6. Solid state lasers (GaInAsP)
7. Hard coatings (AlN)
8. Solar cells (CdS)
9. Phosphors (ZnS, $Zn_2SiO_4$)
10. Antireflection coatings (ZnS)

TABLE II

GROWTH CONDITIONS

EXAMPLE 1
Growth of ZnS

| | | | |
|---|---|---|---|
| Reactants | $(CH_3)_2Zn$ (DMZ) | | |
| | Thiophene $C_4H_4S$ | | |
| Carrier gas | $H_2$ | | |
| Substrate Temperature | 500° C. | | |
| Flow rates | DMZ | 5 cc/min | (−10° C.) |
| | Thiophene (large excess) | 50 cc/min | (20° C.) |

EXAMPLE 2
Growth of ZnS

| | | | |
|---|---|---|---|
| Reactants | $(CH_3)_2Zn$ | | |
| | Tetrahydrothiophene | $C_4H_8S$ | |
| | Tetramethylenesulphide | | |
| Carrier gas | $H_2$ | | |
| Substrate Temperature | 500–650° C. | | |
| Flow rates | DMZ | 5 cc/min | (−10° C.) |
| | $C_4H_8S$ | 200 cc/min | (20° C.) |

EXAMPLE 3
Growth of ZnO

| | | | |
|---|---|---|---|
| Reactants | $(CH_3)_2Zn$ | | |
| | Furan $C_4H_4O$ | | |
| Carrier gas | $H_2$ (Helium carrier gas may also be employed, but under different conditions) | | |
| Temperature | 400° C. | | |
| Flow rates | DMZ | 2.5 cc/min | (−10° C.) |
| | Furan (large excess) | 80 cc/min | (20° C.) |

EXAMPLE 4
ZnSe

| | | | |
|---|---|---|---|
| Reactants | $(CH_3)_2Zn$ | | |
| | Selenophene $C_4H_4Se$ | | |
| Carrier gas | $H_2$ | | |
| Substrate Temperature | 450–625° C. | | |
| Flow rates | DMZ | 5 cc/min | (−10° C.) |
| | Selenophene | 100 cc/min | (20° C.) |

EXAMPLE 5
ZnO

| | | | |
|---|---|---|---|
| Reactants | $(CH_3)_2Zn$ | | |
| | Ethylene oxide | $C_2H_4O$ | |
| Carrier gas | $H_2$ | | |
| Substrate Temperature | 400° C. | | |
| Flow rates | DMZ | 3 cc/min | (−10° C.) |
| | Ethylene oxide | 200 cc/min | (20° C.) |

EXAMPLE 6
ZnO

| | | | |
|---|---|---|---|
| Reactants | $(CH_3)_2Zn$ | | |
| | Tetrahydropyran | $C_5H_{10}O$ | |
| Carrier gas | $H_2$ | | |
| Substrate Temperature | 300–450° C. | | |
| Flow rates | DMZ | 3 cc/min | (−10° C.) |
| | Tetrahydropyran | 200 cc/min | (20° C.) |

EXAMPLE 7
ZnO

| | | | |
|---|---|---|---|
| Reactants | $(CH_3)_2Zn$ | | |
| | Tetrahydrofuran | $C_4H_8O$ | |
| Carrier gas | $H_2$ | | |
| Substrate temperature | 350–400° C. | | |
| Flow rates | DMZ | 5 cc/min | (−10° C.) |
| | Tetrahydrofuran | 200 cc/min | (20° C.) |

We claim:

1. In a method of inorganic thin film production including the steps of
   (1) forming a vapor stream consisting at least partly of a mixture of the vapors of an organometallic compound and an organic compound incorporating a group V or group VI element, and
   (2) passing the vapor mixture over a heated substrate for reaction and decomposition of the organometallic and organic compounds to deposit an inorganic thin film having metal and group V or group VI element constituents, the improvement comprising using a heterocyclic organic compound incorporating the group V or VI element as a ring member, whereby undesired reaction between vapor stream constituents is inhibited.

2. A method according to claim 1 wherein the organometallic compound incorporates a group II or group III element.

3. A method according to claim 1 wherein the vapour stream includes a mixture of at least three vapours.

4. A method according to claim 2 or 3 wherein the mixture includes a vapour appropriate to provide a film dopant when co-deposited with other film constituents.

5. A method according to claim 2 wherein the heterocyclic organic compound is an aliphatic ring compound.

6. A method according to claim 5 wherein the aliphatic ring compound is selected from the group consisting of cyclic arsines, cyclic stibines, cyclic amines, cyclic ethers, cyclic thioethers, cyclic selenoethers and cyclic telluroethers.

7. A method according to claim 2 wherein the heterocyclic organic compound is an aromatic ring compound.

8. A method according to claim 7 wherein the aromatic ring compound is selected from the group consisting of arsoles, phospholes, stiboles, pyrroles, furans, thiophenes, selenophenes and tellurophenes.

* * * * *